United States Patent
Chadha et al.

(10) Patent No.: US 9,645,769 B2
(45) Date of Patent: May 9, 2017

(54) PERFORMANCE ACCELERATION DURING SHUTDOWN OF A DATA STORAGE DEVICE

(71) Applicant: Western Digital Technologies, Inc., Irvine, CA (US)

(72) Inventors: Gurjit S. Chadha, Irvine, CA (US); Pak Khong Lai, Penang (MY)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/523,100

(22) Filed: Oct. 24, 2014

(65) Prior Publication Data

US 2016/0118130 A1  Apr. 28, 2016

(51) Int. Cl.
G06F 12/00 (2006.01)
G06F 3/06 (2006.01)
G11C 16/22 (2006.01)

(52) U.S. Cl.
CPC .......... G06F 3/0679 (2013.01); G06F 3/0619 (2013.01); G06F 3/0653 (2013.01); G11C 16/225 (2013.01)

(58) Field of Classification Search
CPC .... G06F 3/0679; G06F 3/0619; G06F 3/0653; G11C 16/225
USPC ......... 713/100, 300, 320, 324, 340; 711/103
See application file for complete search history.

(56) References Cited

U.S. PATENT DOCUMENTS

| | | | |
|---|---|---|---|
| 6,125,450 A * | 9/2000 | Kardach | G06F 1/3215 713/320 |
| 6,199,127 B1 * | 3/2001 | Ajanovic | G06F 13/1605 710/100 |
| 8,429,436 B2 * | 4/2013 | Fillingim | G11C 5/141 711/100 |
| 8,554,983 B2 | 10/2013 | Jeddeloh | |
| 8,751,836 B1 * | 6/2014 | Piszczek | G06F 1/3268 713/300 |
| 2003/0159024 A1 * | 8/2003 | Chen | G06F 1/3203 713/1 |
| 2011/0167286 A1 * | 7/2011 | Varadarajan | G06F 1/3287 713/323 |
| 2012/0047319 A1 | 2/2012 | Yoon et al. | |
| 2012/0102263 A1 | 4/2012 | Aswadhati | |
| 2013/0086302 A1 | 4/2013 | Tressler et al. | |
| 2014/0244899 A1 * | 8/2014 | Schmier | G06F 3/0616 711/103 |

OTHER PUBLICATIONS

"SSD Performance: XceedIOPS2, XceedStor 500S, Xcel-200," Application Note AN007, Smart Storage Systems, May 2012, 11 pp.
Lee et al., "Lifetime Management of Flash-Based SSDs Using Recovery-Aware Dynamic Throttling," Seoul National University, Korea, Feb. 2012, 14 pp.
Skourtis et al., "Latency Minimization in SSD Clusters for Free," Department of Computer Science, University of California, Santa Cruz, Jul. 2013, 7 pp.

* cited by examiner

*Primary Examiner* — Pierre-Michel Bataille
(74) *Attorney, Agent, or Firm* — McDermott Will & Emery LLP

(57) ABSTRACT

A storage device may include a non-volatile memory; and a controller. The controller may be configured to: operate the data storage device in a standard mode by at least throttling performance, and, responsive to detecting a power loss condition, operate the data storage device in a shutdown mode by at least disabling the throttling.

20 Claims, 4 Drawing Sheets

PERFORMANCE ACCELERATION DURING SHUTDOWN OF A DATA STORAGE DEVICE

TECHNICAL FIELD

This disclosure relates to performance throttling, and more particularly, to selective enabling of performance throttling for solid state drives.

BACKGROUND

Memory devices used in computers or other electronics devices may be non-volatile memory or volatile memory. The main difference between non-volatile memory and volatile memory is that non-volatile memory may continue to store data without requiring a persistent power supply. As a result, non-volatile memory devices have developed into a popular type of memory for a wide range of electronic applications. For instance, non-volatile memory devices, including flash memory devices, are commonly incorporated into solid-state storage devices, such as solid-state drives (SSDs).

In some examples, in addition to the non-volatile flash memory, an SSD may include volatile memory which may be used as a cache by an SSD controller. For instance, an SSD controller may utilize the volatile memory to store critical operational information and/or to temporarily store data before it is written to the flash memory. However, as the memory is volatile, an SSD controller may copy the contents of the volatile memory to the non-volatile flash memory when shutting down.

SUMMARY

In one example, a method includes operating a data storage device in a standard mode by at least throttling performance of the data storage device. In this example, the method also includes, responsive to detecting a power loss condition, operating the data storage device in a shutdown mode by at least disabling the throttling.

In another example, a data storage device includes a non-volatile memory, and a controller. In this example, the controller is configured to: operate the data storage device in a standard mode by at least throttling performance, and, responsive to detecting a power loss condition, operate the data storage device in a shutdown mode by at least disabling the throttling.

In another example, a computer-readable storage medium stores instructions that, when executed, cause one or more processors of a data storage device to: operate the data storage device in a standard mode by at least throttling performance of the data storage device, and, responsive to detecting a power loss condition, operate the data storage device in a shutdown mode by at least disabling the throttling.

In another example, a system includes means for operating a data storage device in a standard mode by at least throttling performance of the data storage device, and means for operating the data storage device in a shutdown mode by at least disabling the throttling in response to detecting a power loss condition.

The details of one or more examples are set forth in the accompanying drawings and the description below. Other features, objects, and advantages will be apparent from the description and drawings, and from the claims.

DETAILED DESCRIPTION

SSDs typically include both volatile memory and non-volatile memory (e.g., flash memory). When the SSD shuts down, such as where the SSD experiences a loss of power from a host device, the SSD may need to write the data stored in the volatile memory into the non-volatile memory in order to prevent data loss. In some examples, there may be a limited amount of power available for such copying as an onboard backup power source may only be able to provide a limited amount of power for a limited amount of time. As such, it may be desirable to reduce the amount of time required and/or the amount of power consumed by an SSD when copying the contents of the volatile memory to the non-volatile memory. However, an SSD is typically designed with a balance of three factors: cost, power, and performance, which may be inter-related such that improving one factor worsens another factor. Thus, additional power is typically required to reduce the amount of time required to copy the data from the volatile memory to the non-volatile memory or additional time is typically required to reduce the amount of power required to copy the data. For instance, an SSD controller may reduce the amount of power consumed by an SSD by limiting the amount of read/write activities performed, which may be referred to herein as "throttling" or "performance throttling."

In accordance with one or more techniques of this disclosure, an SSD controller may disable performance throttling when copying the contents of the volatile memory to the non-volatile memory. In this way, the SSD controller may reduce the amount of time required to copy the contents of the volatile memory to the non-volatile memory.

In some examples, one or more components of the SSD may consume a reduced amount of power while the SSD controller is copying the contents of the volatile memory to the non-volatile memory (e.g., in response to losing power from the host device). For instance, one or more components of the SSD that interface with a host device may consume a reduced amount of power in response to losing power from the host device. In this way, the amount of power consumed by the SSD when copying the content of the volatile memory to the non-volatile memory may also be reduced. As less power is consumed by the SSD when copying the contents of the volatile memory to the non-volatile memory with throttling disabled, the capacity of the onboard backup power source may be similarly reduced, which may reduce the cost and/or size of the onboard backup power source.

Figure 1:
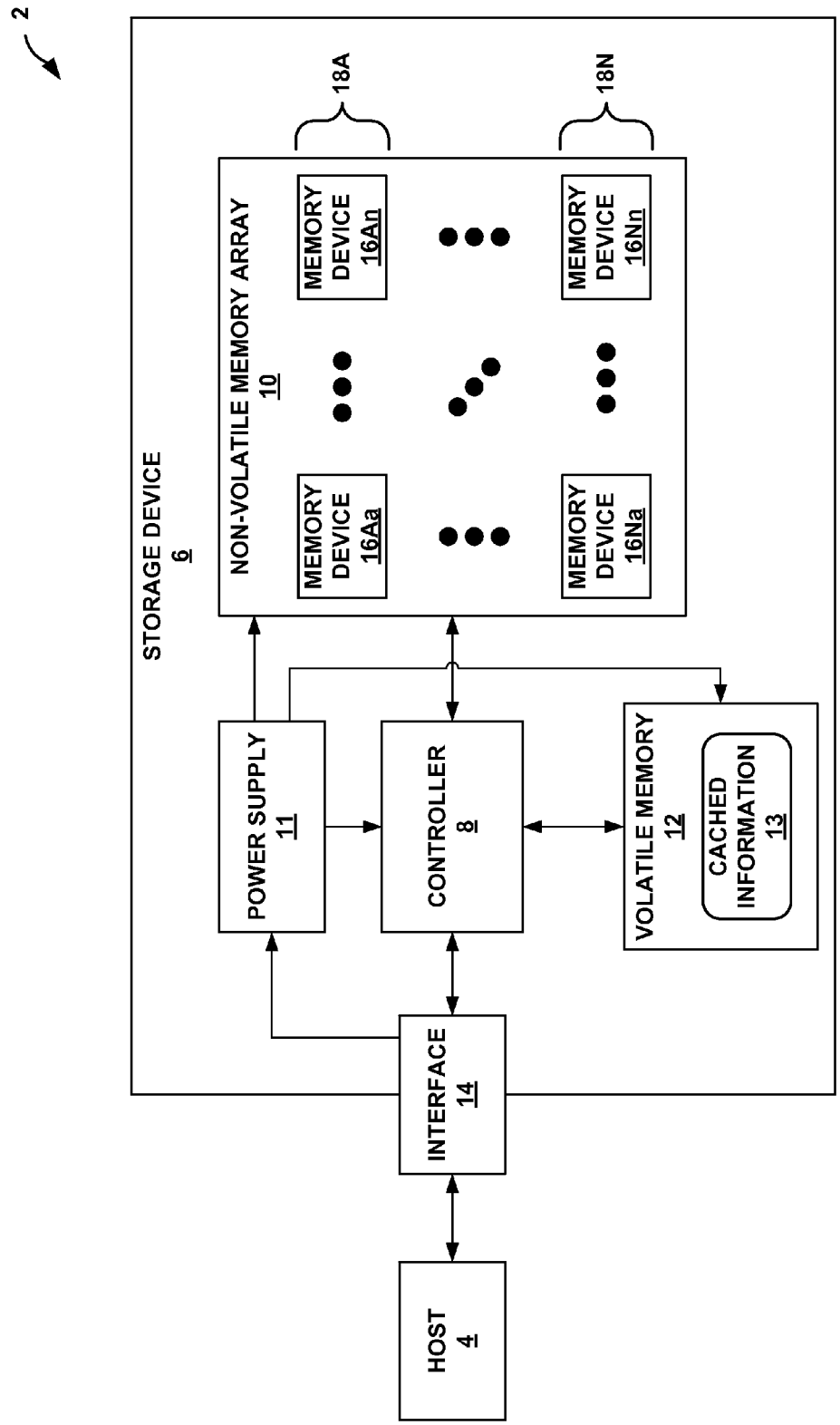
FIG. 1 is a conceptual and schematic block diagram illustrating an example storage environment in which a storage device may function as a storage device for a host device, in accordance with one or more techniques of this disclosure

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, that may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1 storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), and PCI-express. The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4. As illustrated in FIG. 1, power supply 11 may receive power from host device 4 via interface 14.

Storage device 6 may include NVMA 10 which may include a plurality of memory devices 16Aa-16Nn (collectively, "memory devices 16") which may each be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 6 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory devices. Some examples, of memory devices 16 include, but are not limited to flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

Flash memory devices may include NAND or NOR based flash memory devices, and may store data based on a charge contained in a floating gate of a transistor for each flash memory cell. In NAND flash memory devices, the flash memory device may be divided into a plurality of blocks which may divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Controller 6 may write data to and read data from NAND flash memory devices at the page level and erase data from NAND flash memory devices at the block level.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16Nn may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

In some examples, storage device 6 may include a number of memory devices 16 selected to provide a total capacity that is greater than the capacity accessible to host device 4. This is referred to as over-provisioning. For example, if storage device 6 is advertised to include 240 GB of user-accessible storage capacity, storage device 6 may include sufficient memory devices 16 to give a total storage capacity of 256 GB. The 16 GB of storage devices 16 may not be accessible to host device 4 or a user of host device 4. Instead, the additional storage devices 16 may provide additional blocks to facilitate writes, garbage collection, wear leveling, and the like. Further, the additional storage devices 16 may provide additional blocks that may be used if some blocks wear to become unusable and are retired from use. The presence of the additional blocks may allow retiring of the worn blocks without causing a change in the storage capacity available to host device 4. In some examples, the amount of over-provisioning may be defined as p=(T−D)/D, wherein p is the over-provisioning ratio, T is the total storage capacity of storage device 2, and D is the storage capacity of storage device 2 that is accessible to host device 4.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 6 may include volatile memory 12, which may be used by controller 8 to store information. In some examples, controller 8 may use volatile memory 12 as a cache. For instance, controller 8 may store cached information 13 in volatile memory 12. As illustrated in FIG. 1, volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes controller 8, which may manage one or more operations of storage device 6. For instance, controller 8 may manage the reading of data from and/or the writing of data to memory devices 16. As discussed above, controller 8 may use volatile memory 12 to store information. In some examples, such as when storage device 6 is shutting down, controller 8 may be configured to copy some or all of the information stored in volatile memory 12, such as cached information 13, to one or more of memory devices 16. Additional details of controller 8 are discussed below with reference to FIG. 2.

In accordance with one or more techniques of this disclosure, controller 8 may operate in a plurality of modes, such as a standard mode and a shutdown mode. In the standard mode, controller 8 may throttle performance of storage device 6, such as by reducing a rate at which data may be written to and/or read from memory devices 16. In the shutdown mode, controller 8 may reduce and/or disable the performance throttling, such as be increasing the rate at which data may be written to memory devices 16. Additionally, when operating in the shutdown mode, controller 8 may copy some or all of the information stored in volatile memory 12 to one or more of memory devices 16. By reducing and/or disabling the performance throttling when operating in the shutdown mode, controller 8 may reduce the amount time taken to copy the information stored in volatile memory 12 to one or more of memory devices 16.

Figure 2:
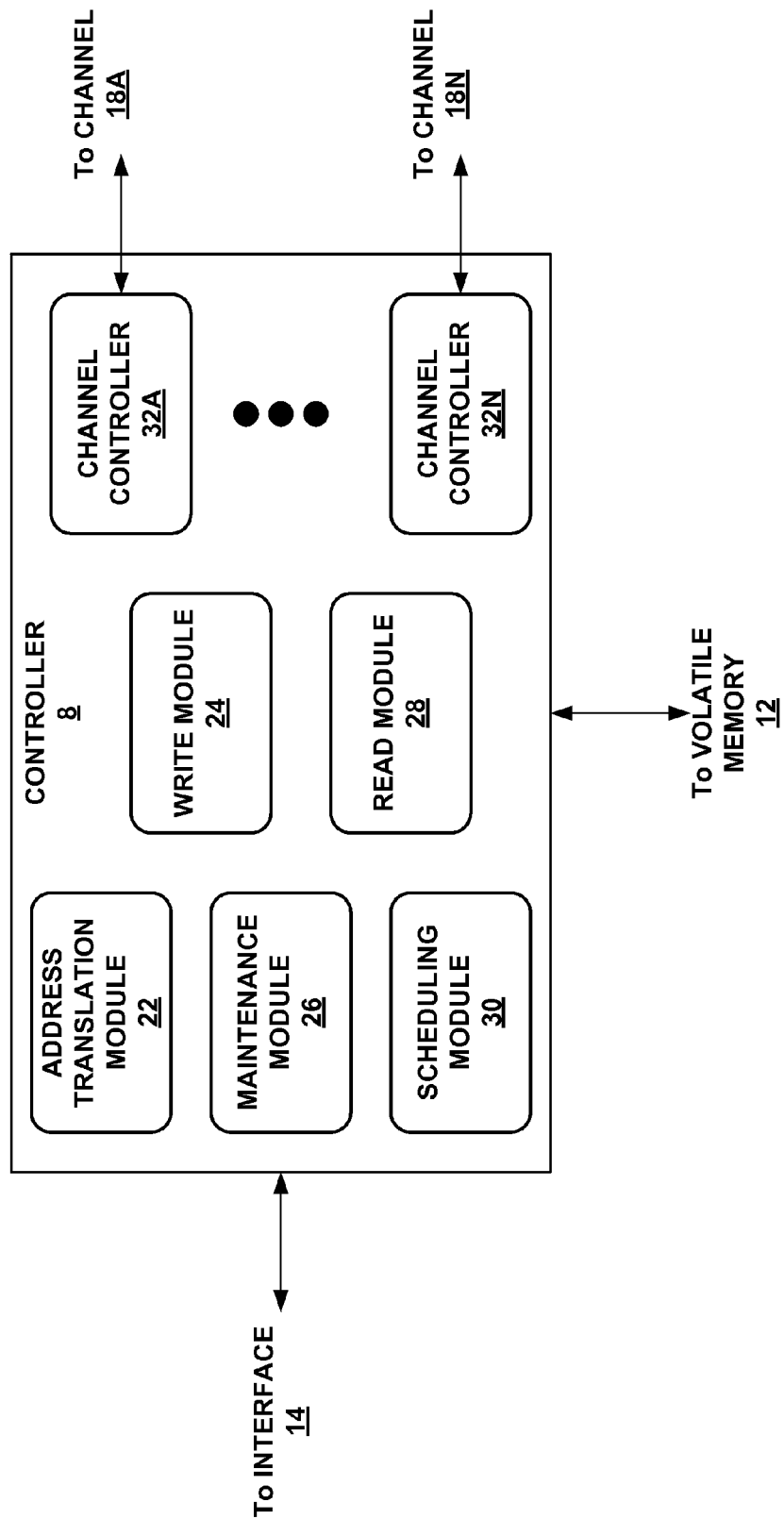
FIG. 2 is a conceptual and schematic block diagram illustrating an example controller, in accordance with one or more techniques of this disclosure.

FIG. 2 is a conceptual and schematic block diagram illustrating example details of controller 8. In some examples, controller 8 may include an address translation module 22, a write module 24, a maintenance module 26, a read module 28, a scheduling module 30, and a plurality of channel controllers 32A-32N (collectively, "channel controllers 28"). In other examples, controller 8 may include additional modules or hardware units, or may include fewer modules or hardware units. Controller 8 may include a microprocessor, digital signal processor (DSP), application specific integrated circuit (ASIC), field programmable gate array (FPGA), or other digital logic circuitry. In some examples, controller 8 may be a system on a chip (SoC).

Controller 8 may interface with the host device 4 via interface 14 and manage the storage of data to and the retrieval of data from memory devices 16. For example, write module 24 of controller 8 may manage writes to memory devices 16. For example, write module 24 may receive a message from host device 4 via interface 14 instructing storage device 6 to store data associated with a logical address and the data. Write module 24 may manage writing of the data to memory devices 16.

For example, write module 24 may communicate with address translation module 22, which manages translation between logical addresses used by host device 4 to manage storage locations of data and physical block addresses used by write module 24 to direct writing of data to memory devices. Address translation module 22 of controller 8 may utilize a flash translation layer or table that translates logical addresses (or logical block addresses) of data stored by memory devices 16 to physical block addresses of data stored by memory devices 16. For example, host device 4 may utilize the logical block addresses of the data stored by memory devices 16 in instructions or messages to storage device 6, while write module 24 utilizes physical block addresses of the data to control writing of data to memory devices 16. (Similarly, read module 28 may utilize physical block addresses to control reading of data from memory devices 16.) The physical block addresses correspond to actual, physical blocks of memory devices 16. In some examples, address translation module 22 may store the flash translation layer or table in volatile memory 12, such as within cached information 13.

In this way, host device 4 may be allowed to use a static logical block address for a certain set of data, while the physical block address at which the data is actually stored may change. Address translation module 22 may maintain the flash translation layer or table to map the logical block addresses to physical block addresses to allow use of the static logical block address by the host device 4 while the physical block address of the data may change, e.g., due to wear leveling, garbage collection, or the like.

As discussed above, write module 24 of controller 8 may perform one or more operations to manage the writing of data to memory devices 16. For example, write module 24 may manage the writing of data to memory devices 16 by selecting one or more blocks within memory devices 16 to store the data and causing memory devices of memory devices 16 that include the selected blocks to actually store the data. As discussed above, write module 24 may cause address translation module 22 to update the flash translation layer or table based on the selected blocks. For instance, write module 24 may receive a message from host device 4 that includes a unit of data and a logical block address, select a block within a particular memory device of memory devices 16 to store the data, cause the particular memory device of memory devices 16 to actually store the data (e.g., via a channel controller of channel controllers 32 that corresponds to the particular memory device), and cause address translation module 22 to update the flash translation layer or table to indicate that the logical block address corresponds to the selected block within the particular memory device.

In some examples, after receiving the unit of data from host device 4, write module 24 may utilize volatile memory 12 to temporarily store the unit of data prior to causing one or more of memory devices 16 to actually store the data. In some examples, write module 24 may be configured to send host device 4 a message indicating whether the data was successfully stored. However, in some examples, write module 24 may send the message to host device 4 confirming successful storage of the data before the data is actually stored. For instance, write module 24 may send the message to host device 4 confirming successful storage of the data when the data is stored in volatile memory 12.

In some examples, in addition to causing the data to be stored by memory devices 16, write module 24 may cause memory devices 16 to store information which may be used to recover the unit of data should one or more of the blocks fail or become corrupted. The parity information may be used to recover the data stored by other blocks. In some examples, the parity information may be an XOR of the data stored by the other blocks.

In order to write a bit with a logical value of 0 (charged) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Thus, to write even an amount of data that would consume less than one page, controller 8 may cause an entire block to be erased. This may lead to write amplification, which refers to the ratio between the amount of data received from host device 4 to be written to memory devices 16 and the amount of data actually written to memory devices 16. Write amplification contributes to faster wearing of the flash memory cells than would occur with no write amplification. Wear to flash memory cells may occur when flash memory cells are erased due to the relatively high voltages used to erase the flash memory cells. Over a plurality of erase cycles, the relatively high voltages may result in changes to the flash memory cells. Eventually, the flash memory cells may wear out, such that data may no longer be written to the cells.

One technique that controller 8 may implement to reduce write amplification and wear of flash memory cells includes writing data received from host device 4 to unused blocks or partially used blocks. For example, if host device 4 sends data to storage device 6 that includes only a small change from data already stored by storage device 6. The controller then may mark the old data as stale or no longer valid. Over time, this may reduce a number of erase operations blocks are exposed to, compared to erasing the block that holds the old data and writing the updated data to the same block.

Responsive to receiving a write command from host device 4, write module 24 may determine at which physical locations (e.g., blocks) of memory devices 16 to write the data. For example, write module 24 may request from address translation module 22 or maintenance module 26 one or more physical block addresses that are empty (e.g., store no data), partially empty (e.g., only some pages of the block store data), or store at least some invalid (or stale) data. Upon receiving the one or more physical block addresses, write module 24 may select one or more block as discussed above, and communicate a message that causes channel controllers 32A-32N (collectively, "channel controllers 32") to write the data to the selected blocks.

Read module 28 similarly may control reading of data from memory devices 16. For example, read module 28 may receive a message from host device 4 requesting data with an associated logical block address. Address translation module 22 may convert the logical block address to a physical block address using the flash translation layer or table. Read module 28 then may control one or more of channel controllers 32 to retrieve the data from the physical block addresses. Similar to write module 24, read module 28 may select one or more blocks and communicate a message to that causes channel controllers 32 to read the data from the selected blocks.

Each channel controller of channel controllers 32 may be connected to a respective channel of channels 18. In some examples, controller 8 may include the same number of channel controllers 32 as the number of channels 18 of storage device 2. Channel controllers 32 may perform the intimate control of addressing, programming, erasing, and reading of memory devices 16 connected to respective channels, e.g., under control of write module 24, read module 28, and/or maintenance module 26.

Maintenance module 26 may be configured to perform operations related to maintaining performance and extending the useful life of storage device 6 (e.g., memory devices 16). For example, maintenance module 26 may implement at least one of wear leveling or garbage collection.

As described above, erasing flash memory cells may use relatively high voltages, which, over a plurality of erase operations, may cause changes to the flash memory cells. After a certain number of erase operations, flash memory cells may degrade to the extent that data no longer may be written to the flash memory cells, and a block including those cells may be retired (no longer used by controller 8 to store data). To increase the amount of data that may be written to memory devices 16 before blocks are worn and retired, maintenance module 26 may implement wear leveling.

In wear leveling, maintenance module 26 may track a number of erases of or writes to a block or a group of blocks, for each block or group of blocks. Maintenance module 26 may cause incoming data from host device 4 to be written to a block or group of blocks that has undergone relatively fewer writes or erases, to attempt to maintain the number of writes or erases for each block or group of blocks approximately equal. This may cause each block of memory devices 16 to wear out at approximately the same rate, and may increase the useful lifetime of storage device 6.

Although this may reduce write amplification and wear of flash memory cells by reducing a number of erases and writing data to different blocks, this also may lead to blocks including some valid (fresh) data and some invalid (stale) data. To combat this, maintenance module 26 may implement garbage collection. In a garbage collection operation, maintenance module 26 may analyze the contents of the blocks of memory devices 16 to determine a block that contain a high percentage of invalid (stale) data. Maintenance module 26 then may rewrite the valid data from the block to a different block, and then erase the block. This may reduce an amount of invalid (stale) data stored by memory devices 16 and increase a number of free blocks, but also may increase write amplification and wear of memory devices 16.

Scheduling module 30 of controller 8 may perform one or more operations to schedule activities to be performed by memory devices 16. For instance, scheduling module 30 may schedule requests received from other components of controller 8 to command one or more of memory devices 16 to perform one or more activities during run-time. In some examples, scheduling module 30 may schedule the requests to be performed in the order in which they were received (e.g., first-in first-out or FIFO). In some examples, scheduling module 30 may schedule the requests based one or more factors which may include, but are not limited to, the type of request (e.g., a read request, a write request, an erase request, a garbage collection request, etc.), an amount of time elapsed since the request was received, an amount of power that would be consumed by performance of the request, bandwidth considerations, and the like.

In some examples, such as to comply with a power consumption budget, scheduling module 30 may schedule activities to be performed such that performance is throttled. For instance, where the power consumption budget allocates an amount of power to memory devices 16 that is less than an amount of power that would be consumed if all of memory devices 16 were concurrently active, scheduling module 30 may schedule activities to be performed such that the amount of power consumed by memory devices 16 does not exceed to amount of power allocated to memory devices 16.

As one example, where storage device 6 has a power consumption target of 25 W, the power consumption budget may allocate a portion of the power consumption target (e.g., 16 W) for use by memory devices 16. If the amount of power that would be consumed if all of memory devices 16 were concurrently active is greater than the allocated portion of the power consumption target (e.g., 16 W), scheduling module 30 may determine a quantity of memory devices 16 that may be currently active without consuming more power than the allocated portion. For instance, where memory devices 16 are allocated X units of a power consumption budget and each memory device of memory devices 16 consumed one unit of power when active, scheduling module 30 may determine that X memory devices of memory devices 16 may be concurrently active.

In some examples, scheduling module 30 may be configured to selectively enable the performance throttling. For instance, scheduling module 30 may enable throttling when operating in a first mode and disable throttling when operating in a second mode. In some examples, such as where throttling reduces the amount of memory devices 16 that may be concurrently active, the rate at which scheduling module 30 may cause data may be written to memory devices 16 may be lower in when throttling is enabled as compared to when throttling is disabled.

In accordance with one or more techniques of this disclosure, storage device 6 may operate in a plurality of modes, such as a standard mode and a shutdown mode. In the standard mode, power supply 11 may supply power to components of storage device 6 using power received from host device 4. Also in the standard mode, scheduling module 30 may enable performance throttling such that the rate at which data may be written to/read from memory devices 16 is reduced. In this way, scheduling module 30 may reduce the amount of power consumed by memory devices 16 to e.g., comply with a power consumption budget.

When operating in the standard mode, write module 24 may receive data to be stored from host device 4 via interface 14. Responsive to receiving the data to be stored, write module 24 may temporarily store the data to be stored in volatile memory 12, select one or more blocks within memory devices 16 to store the data, and request that scheduling module 30 schedule activities to copy the data from volatile memory 12 to the selected one or more blocks. In some examples, write module 24 may cause address translation module 22 to update the flash translation layer or table, which may be stored in volatile memory 12, based on the selected one or more blocks. Write module 24 may send a message to host device 4 to confirm that the data has been successfully stored. In some examples, write module 24 may send the message responsive to storing the data in volatile memory 12 (i.e., before the data has been written to the selected one or more blocks).

Storage device 6 may transition to operation in the shutdown mode based on one or more conditions. As one example, storage device 6 may transition into the shutdown mode based on a signal received from host device 4 requesting that storage device 6 shut down. As another example, storage device 6 may transition into the shutdown mode in response to detecting a power loss condition. For instance, storage device 6 may detect the power loss condition in response to a change in a voltage level of the power received from host device 4 and/or in response to ceasing to receive power from host device 4.

In any case, when operating in the shutdown mode, write module 24 may copy the contents of volatile memory 12 to one or more of memory devices 16. For instance, write module 24 may select one or more blocks within memory devices 16 to store the contents of volatile memory 12, and request that scheduling module 30 schedule activities to copy the contents of volatile memory 12 to the selected one or more blocks. In accordance with one or more techniques of this disclosure, when storage device 6 is operating in the shutdown mode, scheduling module 30 may disable the performance throttling. For instance, scheduling module 30 may schedule the activities to copy the contents of volatile memory 12 to the selected one or more blocks such that a quantity of memory devices 16 that are concurrently active is greater than the quantity of memory devices 16 that may be concurrently active during the standard mode. In this way, scheduling module 30 may reduce the amount of time required to copy the contents of volatile memory 12 to memory devices 16.

In some examples, while disabling the throttling may cause the amount of power consumed by memory devices 16 in the shutdown mode to be greater than the amount of power consumed by memory devices 16 in the standard mode, storage device 6 may consume less power overall in the shutdown mode than in the standard mode. For instance, when operating in the shutdown mode, storage device 6 may stop performing read/write operations at the request of host device 4, which may reduce the amount of power consumed by controller 8. For instance, when not performing read/write operations at the request of host device 4, the amount of power consumed by controller 8 to perform front-end host-interface operations, such as serialization/deserialization (SerDes), may be reduced. In this way, techniques of this disclosure may reduce the total amount of power consumed by storage device 6 in the shutdown mode.

In the shutdown mode, power supply 11 may supply power to components of storage device 6 using power stored in an onboard backup power source. As discussed above, as the amount of power stored by the onboard backup power source increases, the cost and/or the size of the onboard backup power source may also increase. As the techniques of this disclosure may enable a reduction in the amount of time required to copy the contents of volatile memory 12 to memory devices 16 and/or a reduction in the total amount of power consumed by storage device 6 in the shutdown mode, the techniques of this disclosure may further enable a reduction in the cost and/or size of the onboard backup power source.

Figure 3:
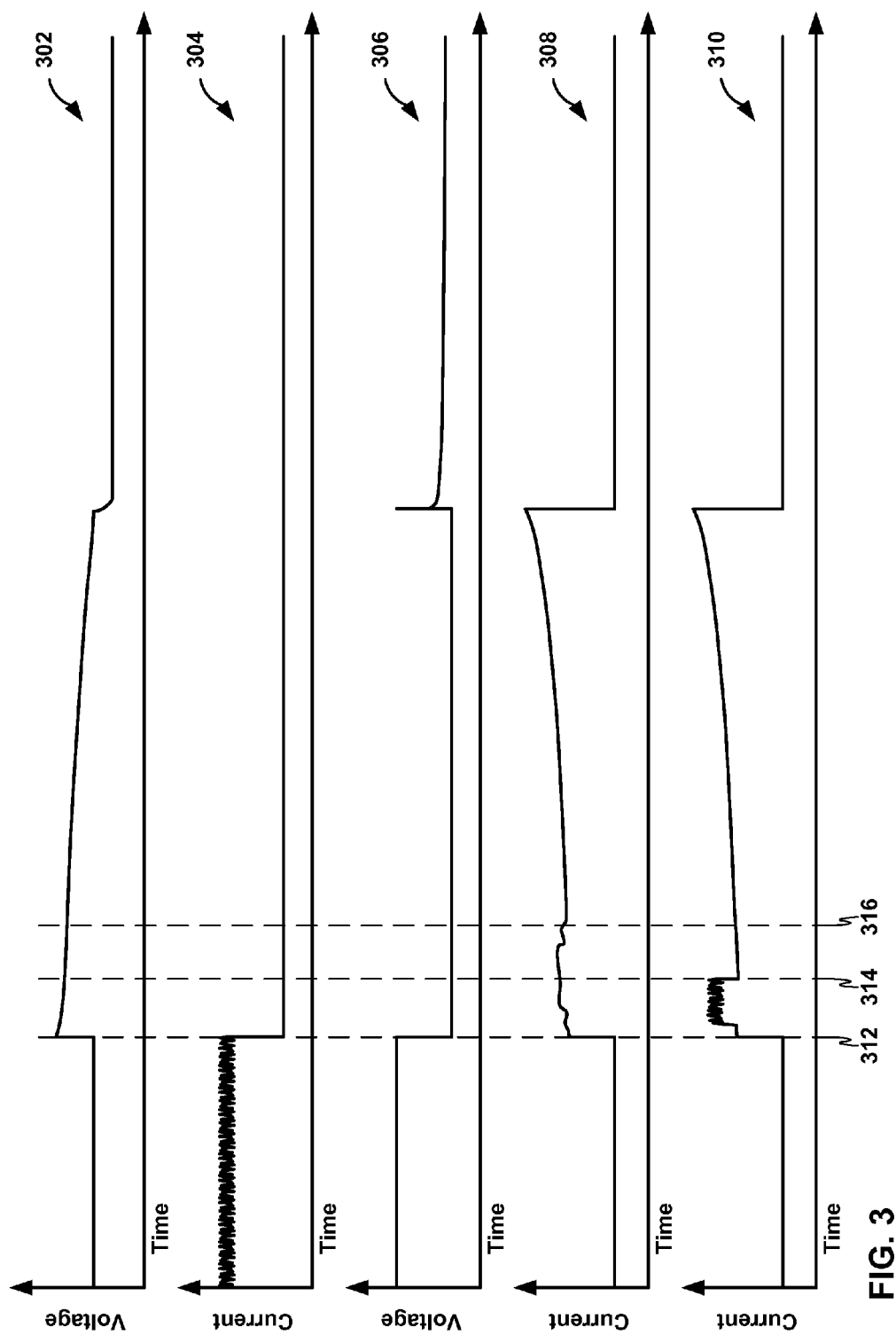
FIG. 3 is a graph illustrating exemplary signals of an example storage device, in accordance with one or more techniques of this disclosure.

FIG. 3 is a graph illustrating exemplary signals of an example storage device, in accordance with one or more techniques of this disclosure. As illustrated in FIG. 3, plot 302 may include a horizontal axis representing time, a vertical axis representing voltage, and a voltage signal; plot 304 may include a horizontal axis representing time, a vertical axis representing current, and a current signal; plot 306 may include a horizontal axis representing time, a vertical axis representing voltage, and a voltage signal; plot 308 may include a horizontal axis representing time, a vertical axis representing current, and a current signal; and plot 310 may include a horizontal axis representing time, a vertical axis representing current, and a current signal.

In some examples, the voltage signal of plot 302 may represent the voltage across an onboard backup power source, such as the onboard backup power source included in power supply 11 of FIG. 1. In some examples, the current signal of plot 304 may represent the current level of a power signal received by a storage device, such as storage device 6 of FIG. 1, from a host device, such as host device 4 of FIG. 1. In some examples, the voltage signal of plot 306 may represent a power fail indication (nPFO) signal of a storage device, such as storage device 6 of FIG. 1. In some examples, the current signal of plot 308 may represent an amount of current consumed by a storage device that does not disable throttling when operating in a shutdown mode. In some examples, the current signal of plot 310 may represent an amount of current consumed by a storage device that disables throttling when operating in a shutdown mode.

The three dashed vertical lines illustrated in FIG. 3 each correspond to a respective time as which a respective event occurs. For instance, time 312 may be a time where a storage device detects a power loss condition, time 314 may be a time where a storage device that disables throttling when operating in a shutdown mode completes copying data stored on a volatile memory (e.g., cached information 13 stored on volatile memory 12 of FIG. 1) to one or more non-volatile memory devices (e.g., memory devices 16 of non-volatile memory array 10 of FIG. 1), and time 316 may be a time where a storage device that does not disable throttling when operating in a shutdown mode completes copying data stored on a volatile memory to one or more non-volatile memory devices. As shown in FIG. 3, the storage device that disables throttling when operating in a shutdown mode completes copying data stored on a volatile memory to one or more non-volatile memory devices before the storage device that does not disable throttling when operating in a shutdown mode. As one example, the storage device that disables throttling when operating in a shutdown mode may complete copying data stored on a volatile memory to one or more non-volatile memory devices in 231 ms and the storage device that does not disable throttling when operating in a shutdown mode may complete copying data stored on a volatile memory to one or more non-volatile memory devices in 447 ms.

As discussed above, when operating in a standard mode, storage device 6 may receive power from host device 4. As illustrated in FIG. 3, storage device 6 may operate in the standard mode prior to time 312 using power received from host device 4 as shown by plot 304.

As discussed above, responsive to detecting a power loss condition, storage device 6 may operate in a shutdown mode. In some examples, storage device 6 may detect the power loss condition based on a power fail indication signal, such as the power fail indication signal of plot 306. As illustrated by plot 306, the power fail indication signal may transition from high to low at time 312. In some examples, the power fail indication signal may transition from high to low in response to the voltage level of the power received by a storage device falls below a threshold (e.g., if the voltage level of the received power is normally 12V, the power fail indication signal may transition from high to low in response the voltage level of the received power falling below 9.4V).

Figure 4:
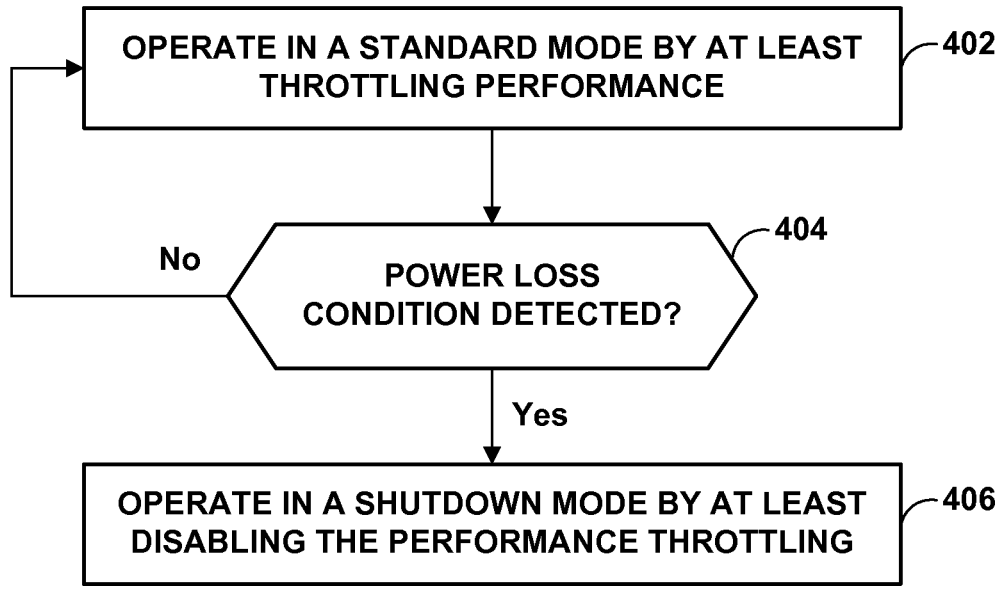
FIG. 4 is a flow diagram illustrating an example technique for selectively enabling performance throttling in a storage device, in accordance with one or more techniques of this disclosure.

FIG. 4 is a flow diagram illustrating an example technique for selectively enabling performance throttling in a storage device, in accordance with one or more techniques of this disclosure. The techniques of FIG. 4 will be described with concurrent reference to storage device 6 of FIG. 1 and controller 8 of FIG. 1 and FIG. 2 for ease of description, although storage devices having configurations different than that of storage device 6, and controller 8 may perform the techniques of FIG. 4.

In accordance with one or more techniques of this disclosure, storage device 6 may operate in a standard mode by at least throttling performance (402). For instance, scheduling module 30 of controller 8 of storage device 6 may throttle performance by scheduling activities such that data may be written to memory devices 16 at a first rate (e.g., such that a first quantity of memory devices 16 may be concurrently active).

Storage device 6 may determine whether a power loss condition has been detected (404). In some examples, controller 8 of storage device 6 may determine that the power loss condition has been detected in response to ceasing to receive power from host device 4. Responsive to determining that the power loss condition has not been detected ("No" branch of 404), storage device 6 may continue to operate in the standard mode with performance throttled (402).

Responsive to determining that the power loss condition has been detected ("Yes" branch of 404), storage device 6 may operate in the shutdown mode by at least disabling the performance throttling (406). For instance, scheduling module 30 of controller 8 of storage device 6 may disable the performance throttling by scheduling activities such that data may be written to memory devices 16 at a second rate that is greater than the first rate (e.g., such that a second quantity of memory devices 16 may be concurrently active that is greater than the first quantity). In some examples, as opposed to completely disabling the performance throttling, scheduling module 30 may operate in the shutdown mode by at least partially disabling the performance throttling such that data may be written to memory devices 16 at a third rate that is greater than the first rate but less than the second rate (e.g., such that a third quantity of memory devices 16 may be concurrently active that is greater than the first quantity but less than the second quantity).

As discussed above, while operating in the shutdown mode, write module 24 may copy some or all of the contents of volatile memory 12 to one or more of memory devices 16. For instance, write module 24 may copy cached information 13 and/or other data from volatile memory 12 to one or more of memory devices 16 while operating in the shutdown mode. As such, by disabling throttling when operating in the shutdown mode, scheduling module 30 may reduce the amount of time needed to copy the contents of volatile memory 12 to one or more of memory devices 16.

The following examples may illustrate one or more of the techniques of this disclosure.

Example 1

A method comprising: operating a data storage device in a standard mode by at least throttling performance of the data storage device; and responsive to detecting a power loss condition, operating the data storage device in a shutdown mode by at least disabling the throttling.

Example 2

The method of example 1, wherein: operating the data storage device in the standard mode further comprises throttling performance by at least writing data to a non-volatile memory of the data storage device at a first rate that is less than a maximum write rate of the non-volatile memory, and operating the data storage device in the shutdown mode further comprises disabling the throttling by at least writing data to the non-volatile memory at a second rate that is greater than the first rate such that the non-volatile memory consumes more power in the shutdown mode than in the standard mode.

Example 3

The method of any combination of examples 1-2, wherein one or more other components of the data storage device consume less power in the shutdown mode than in the standard mode such that the data storage device consumes less power while operating in the shutdown mode for an amount of time than while operating in the standard mode for the amount of time.

Example 4

The method of any combination of examples 1-3, wherein: the non-volatile memory comprises an array of non-volatile memory devices, writing data to the array of non-volatile memory devices at the first rate comprises issuing, by a controller of the data storage device, commands that cause a first quantity of the non-volatile memory devices of the array of non-volatile memory devices to be concurrently active, and writing data to the array of non-volatile memory devices at the second rate comprises issuing, by the controller, commands that cause a second quantity of the non-volatile memory devices of the array of non-volatile memory devices to be concurrently active, the second quantity being greater than the first quantity.

Example 5

The method of any combination of examples 1-4, wherein: writing data to the non-volatile memory during the standard mode comprises: receiving, from a host device of the data storage device, data to be stored; storing, in a volatile memory of the data storage device, the data to be stored; and copying, from the volatile memory to the non-volatile memory, the data to be stored, and writing data to the non-volatile memory during the shutdown mode comprises copying, from the volatile memory to the non-volatile memory, cached data that includes a flash translation layer or a flash translation table.

Example 6

The method of any combination of examples 1-5, wherein the cached data further includes the data to be stored.

Example 7

The method of any combination of examples 1-6, wherein: operating the data storage device in the standard mode further comprises operating the data storage device using power provided by a host device, and operating the data storage device in the shutdown mode further comprises operating the data storage device using power stored by the data storage device.

Example 8

The method of any combination of examples 1-7, further comprising: detecting the power loss condition in response to ceasing to receive power from a host device.

Example 9

A data storage device comprising: a non-volatile memory; and a controller configured to: operate the data storage device in a standard mode by at least throttling performance, and responsive to detecting a power loss condition, operate the data storage device in a shutdown mode by at least disabling the throttling.

Example 10

The data storage device of example 9, wherein the controller is configured to: throttle performance by at least writing data to a non-volatile memory of the data storage device at a first rate that is less than a maximum write rate of the non-volatile memory, and disable the throttling by at least writing data to the non-volatile memory at a second rate that is greater than the first rate such that the non-volatile memory consumes more power in the shutdown mode than in the standard mode.

Example 11

The data storage device of any combination of examples 9-10, wherein one or more other components of the data storage device consume less power in the shutdown mode than in the standard mode such that the data storage device consumes less power while operating in the shutdown mode for an amount of time than while operating in the standard mode for the amount of time.

Example 12

The data storage device of any combination of examples 9-11, wherein: the non-volatile memory comprises an array of non-volatile memory devices, the controller is configured to write data to the array of non-volatile memory devices at the first rate by at least issuing commands that cause a first quantity of the non-volatile memory devices of the array of non-volatile memory devices to be concurrently active, and the controller is configured to write data to the array of non-volatile memory devices at the second rate by at least issuing commands that cause a second quantity of the non-volatile memory devices of the array of non-volatile memory devices to be concurrently active, the second quantity being greater than the first quantity.

Example 13

The data storage device of any combination of examples 9-12, further comprising: a volatile memory, wherein: the controller is configured to write data to the non-volatile memory during the standard mode by at least: receiving, from a host device of the data storage device, data to be stored; storing, in the volatile memory, the data to be stored; and copying, from the volatile memory to the non-volatile memory, the data to be stored, and the controller is configured to write data to the non-volatile memory during the shutdown mode by at least copying, from the volatile memory to the non-volatile memory, cached data that includes a flash translation layer or a flash translation table.

Example 14

The data storage device of any combination of examples 9-13, wherein the cached data further includes the data to be stored.

Example 15

The data storage device of any combination of examples 9-14, further comprising: one or more power storage devices, wherein: the controller is further configured to operate the data storage device in the standard mode by at least operating the data storage device using power provided by a host device, and the controller is further configured to operate the data storage device in the shutdown mode by at least operating the data storage device using power stored by at least one of the one or more power storage devices.

Example 16

The data storage device of any combination of examples 9-15, wherein the controller is configured to detect the power loss condition in response to ceasing to receive power from a host device.

Example 17

A computer-readable storage medium storing instructions that, when executed, cause a controller of a data storage device to: operate the data storage device in a standard mode by at least throttling performance of the data storage device; and responsive to detecting a power loss condition, operate the data storage device in a shutdown mode by at least disabling the throttling.

Example 18

The computer-readable storage medium of example 17, wherein: the instructions that cause the controller to throttle performance comprise instructions that cause the controller to write data to a non-volatile memory of the data storage device at a first rate that is less than a maximum write rate of the non-volatile memory, and the instructions that cause the controller to disable the throttling comprise instructions that cause controller to write data to the non-volatile memory at a second rate that is greater than the first rate such that the non-volatile memory consumes more power in the shutdown mode than in the standard mode.

Example 19

The computer-readable storage medium of example 17, further storing instructions that cause the one or more processors to perform any combination of the method of examples 1-8.

Example 20

A system comprising: means for operating a data storage device in a standard mode by at least throttling performance of the data storage device; and means for operating the data storage device in a shutdown mode by at least disabling the throttling in response to detecting a power loss condition.

Example 21

The system of example 20, wherein: the means for operating the data storage device in the standard mode by at least throttling performance of the data storage device comprise means for writing data to a non-volatile memory of the data storage device at a first rate that is less than a maximum write rate of the non-volatile memory, and the means for operating the data storage device in the shutdown mode by at least disabling the throttling comprise means for writing data to the non-volatile memory at a second rate that is greater than the first rate such that the non-volatile memory consumes more power in the shutdown mode than in the standard mode.

Example 22

The system of example 20, further comprising means for performing any combination of the method of examples 1-8.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
operating, by a controller, a data storage device that includes a non-volatile memory in a standard mode by at least throttling performance of the data storage device, wherein throttling performance of the data storage device comprises writing data to the non-volatile memory of the data storage device at a first rate that is less than a maximum write rate of the non-volatile memory; and
responsive to detecting a power loss condition, operating, by the controller, the data storage device in a shutdown mode by at least disabling the throttling, wherein disabling the throttling comprises writing data to the non-volatile memory at a second rate that is greater than the first rate such that the non-volatile memory consumes more power in the shutdown mode than in the standard mode.

2. The method of claim 1, wherein one or more other components of the data storage device consume less power in the shutdown mode than in the standard mode such that the data storage device consumes less power while operating in the shutdown mode for an amount of time than while operating in the standard mode for the amount of time.

3. The method of claim 1, wherein:
the non-volatile memory comprises an array of non-volatile memory devices,
writing data to the array of non-volatile memory devices at the first rate comprises issuing, by a controller of the data storage device, commands that cause a first quantity of the non-volatile memory devices of the array of non-volatile memory devices to be concurrently active, and
writing data to the array of non-volatile memory devices at the second rate comprises issuing, by the controller, commands that cause a second quantity of the non-volatile memory devices of the array of non-volatile memory devices to be concurrently active, the second quantity being greater than the first quantity.

4. The method of claim 1, wherein:
writing data to the non-volatile memory during the standard mode comprises:
receiving, from a host device of the data storage device, data to be stored;
storing, in a volatile memory of the data storage device, the data to be stored; and
copying, from the volatile memory to the non-volatile memory, the data to be stored, and
writing data to the non-volatile memory during the shutdown mode comprises copying, from the volatile memory to the non-volatile memory, cached data that includes a flash translation layer or a flash translation table.

5. The method of claim 4, wherein the cached data further includes the data to be stored.

6. The method of claim 1, wherein:
operating the data storage device in the standard mode further comprises operating the data storage device using power provided by a host device, and
operating the data storage device in the shutdown mode further comprises operating the data storage device using power stored by the data storage device.

7. The method of claim 1, further comprising:
detecting the power loss condition in response to ceasing to receive power from a host device.

8. A data storage device comprising:
a non-volatile memory; and
a controller configured to:
operate the data storage device in a standard mode by at least throttling performance, wherein throttling performance of the data storage device comprises writing data to the non-volatile memory of the data storage device at a first rate that is less than a maximum write rate of the non-volatile memory, and
responsive to detecting a power loss condition, operate the data storage device in a shutdown mode by at least disabling the throttling, wherein disabling the throttling comprises writing data to the non-volatile memory at a second rate that is greater than the first rate such that the non-volatile memory consumes more power in the shutdown mode than in the standard mode.

9. The data storage device of claim 8, wherein one or more other components of the data storage device consume less power in the shutdown mode than in the standard mode such that the data storage device consumes less power while operating in the shutdown mode for an amount of time than while operating in the standard mode for the amount of time.

10. The data storage device of claim 8, wherein:
the non-volatile memory comprises an array of non-volatile memory devices,
the controller is configured to write data to the array of non-volatile memory devices at the first rate by at least issuing commands that cause a first quantity of the non-volatile memory devices of the array of non-volatile memory devices to be concurrently active, and
the controller is configured to write data to the array of non-volatile memory devices at the second rate by at least issuing commands that cause a second quantity of the non-volatile memory devices of the array of non-volatile memory devices to be concurrently active, the second quantity being greater than the first quantity.

11. The data storage device of claim 8, further comprising:
a volatile memory,
wherein:
   the controller is configured to write data to the non-volatile memory during the standard mode by at least:
      receiving, from a host device of the data storage device, data to be stored;
      storing, in the volatile memory, the data to be stored; and
      copying, from the volatile memory to the non-volatile memory, the data to be stored, and
   the controller is configured to write data to the non-volatile memory during the shutdown mode by at least copying, from the volatile memory to the non-volatile memory, cached data that includes a flash translation layer or a flash translation table.

12. The data storage device of claim 11, wherein the cached data further includes the data to be stored.

13. The data storage device of claim 8, further comprising:
one or more power storage devices,
wherein:
   the controller is further configured to operate the data storage device in the standard mode by at least operating the data storage device using power provided by a host device, and
   the controller is further configured to operate the data storage device in the shutdown mode by at least operating the data storage device using power stored by at least one of the one or more power storage devices.

14. The data storage device of claim 8, wherein the controller is configured to detect the power loss condition in response to ceasing to receive power from a host device.

15. A system comprising:
   means for operating a data storage device that includes a non-volatile memory in a standard mode by at least throttling performance of the data storage device, wherein throttling performance of the data storage device comprises writing data to the non-volatile memory of the data storage device at a first rate that is less than a maximum write rate of the non-volatile memory; and
   means for operating the data storage device in a shutdown mode by at least disabling the throttling in response to detecting a power loss condition, wherein disabling the throttling comprises writing data to the non-volatile memory at a second rate that is greater than the first rate such that the non-volatile memory consumes more power in the shutdown mode than in the standard mode.

16. The system of claim 15, further comprising:
a volatile memory;
means for writing data to the non-volatile memory during the standard mode, wherein the means for writing data to the non-volatile memory during the standard mode comprise:
   means for receiving, from a host device of the data storage device, data to be stored;
   means for storing, in the volatile memory, the data to be stored; and
   means for copying, from the volatile memory to the non-volatile memory, the data to be stored; and
means for writing data to the non-volatile memory during the shutdown mode, wherein the means for writing data to the non-volatile memory during the shutdown mode comprise means for copying, from the volatile memory to the non-volatile memory, cached data that includes a flash translation layer or a flash translation table.

17. The system of claim 15, further comprising;
means for storing power;
means for operating the data storage device in the standard mode using power provided by a host device; and
means for operating the data storage device in the shutdown mode using power stored by at least one of the one or more power storage devices.

18. A computer-readable storage medium storing instructions that, when executed, cause a controller of a data storage device that includes a non-volatile memory to:
   operate the data storage device in a standard mode by at least throttling performance of the data storage device, wherein throttling performance of the data storage device comprises writing data to the non-volatile memory of the data storage device at a first rate that is less than a maximum write rate of the non-volatile memory; and
   responsive to detecting a power loss condition, operate the data storage device in a shutdown mode by at least disabling the throttling, wherein disabling the throttling comprises writing data to the non-volatile memory at a second rate that is greater than the first rate such that the non-volatile memory consumes more power in the shutdown mode than in the standard mode.

19. The computer readable storage medium of claim 18, further comprising instructions that cause the controller to:
   write data to the non-volatile memory during the standard mode by at least:
      receiving, from a host device of the data storage device, data to be stored;
      storing, in a volatile memory of the data storage device, the data to be stored; and
      copying, from the volatile memory to the non-volatile memory, the data to be stored, and
   write data to the non-volatile memory during the shutdown mode by at least copying, from the volatile memory to the non-volatile memory, cached data that includes a flash translation layer or a flash translation table.

20. The computer readable storage medium of claim 18, further comprising instructions that cause the controller to:
   operate the data storage device in the standard mode by at least operating the data storage device using power provided by a host device, and
   operate the data storage device in the shutdown mode by at least operating the data storage device using power stored by at least one of one or more power storage devices of the data storage device.

* * * * *